United States Patent
Lee et al.

(10) Patent No.: US 6,260,177 B1
(45) Date of Patent: Jul. 10, 2001

(54) AUTOMATIC CONFIGURATION OF GATE ARRAY CELLS USING A STANDARD CELL FUNCTION LIBRARY

(75) Inventors: Kuochun Lee, Fremont; Ying Cui, San Jose; Tsung Yen Chen, Milpitas, all of CA (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/079,946

(22) Filed: May 15, 1998

Related U.S. Application Data (63) Continuation-in-part of application No. 08/769,964, filed on Dec. 19, 1996, now Pat. No. 6,031,981.

(51) Int. Cl.[7] .................................................. G06F 17/50
(52) U.S. Cl. ............................................................... 716/2
(58) Field of Search ............................. 257/204; 716/18, 716/2

(56) References Cited

U.S. PATENT DOCUMENTS 5,536,955 * 7/1996 Ali .......................................... 257/204
6,134,705 * 10/2000 Pedersen .................................. 716/18

* cited by examiner

Primary Examiner—Matthew Smith
Assistant Examiner—Thuan Do
(74) Attorney, Agent, or Firm—Frank D. Nguyen; Steven Lin; Robert P. Bell (57) ABSTRACT

A method and system to use a standard cell function library to automatically configure gate array cells in an integrated circuit layout is provided. A standard cell netlist at the transistor level is compiled to list the transistors required in implementing the desired functions. Based on the netlist, gate array cells are restructured so that they can be inserted in locations designed for standard cells. The restructured gate array cells, which are made up of single poly and double poly structures, are strategically placed in a layout. Using the function net connectivity patterns from the standard cell function library, the gate array cells are connected to implement desired logic functions.

16 Claims, 12 Drawing Sheets

```
************************************************************************
*   SUB-CIRCUIT NETLIST:
*
*   BLOCK: AND2
*   LAST TIME SAVED: AUG 20 12:12:20 1996
************************************************************************
.SUBCKT AND2  Z  B  A
MXP43  NET773  A       VDD     VDD  TPP  W=4.1  L=0.5
MXP30  NET773  B       VDD     VDD  TPP  W=4.1  L=0.5
MXP39  Z       NET773  VDD     VDD  TPP  W=7.8  L=0.5
MXN32  NET773  B       NET769  GND  TNN  W=2.7  L=0.5
MXN44  NET769  A       GND     GND  TNN  W=2.7  L=0.5
MXN40  Z       NET773  GND     GND  TNN  W=4.6  L=0.5
.ends AND2
```

AUTOMATIC CONFIGURATION OF GATE ARRAY CELLS USING A STANDARD CELL FUNCTION LIBRARY

RELATED APPLICATION

This application is a Continuation-in-part of U.S. patent application having Ser. No. 08/769,964, filed on Dec. 19, 1996 for "RECONFIGURABLE GATE ARRAY CELLS FOR AUTOMATIC ENGINEERING CHANGE ORDER" now U.S. Pat. No. 6,031,981.

FIELD OF THE INVENTION

The invention generally relates to computer-aided design techniques for very large scale integrated circuits, and more particularly relates to configuring gate array cells using a standard cell function library.

BACKGROUND OF THE INVENTION

Rapid advances of very large scale integrated circuit (VLSI) technologies have made design of integrated circuits increasingly complex and time consuming. Computer-Aided Design (CAD) has become a necessity to speed up and improve the quality of VLSI design. Of all the phases in designing application specific VLSI circuits, physical layout takes up a major portion of the turn-around time.

In creating a physical layout of an application specific VLSI circuit, a computer layout is first generated. Generally, the computer layout is created by arranging a number of individual blocks or "logic cells" according to predetermined schematics. The functionality and design of individual logic cells may be predetermined and stored on a computer system as a standardized design. Such design techniques can save considerable time, as it is no longer necessary for an integrated circuit designer to custom design each individual gate and transistor in an integrated circuit. Rather, the circuit designer breaks down a new circuit design into a number of known (or new) cell designs and then combines these cells appropriately to generate a circuit design which performs a desired function. Each of the logic cells contains a number of terminals for implementing into the integrated circuit. These logic cells are commercially available.

To "tape-out" such a circuit layout, commercial "placeand-route" CAD tools, such as Cell3™ from Cadence Design Systems, Inc., of San Jose, Calif., can be utilized. More particularly, place-and-route CAD programs are used 1) to arrange logic cells and other elements to optimize their interconnections and the overall surface area and 2) to define the routing region and to select channels to connect the logic cells and elements. To perform the tasks mentioned above, a place-and-route CAD tool requires as input a predetermined number (including reserves) of predefined logic cell types (e.g., AND-gate, OR-gate, flip-flop, etc.). Information related to the logic cells along with the required terminal connections are provided to the place-and-route CAD tool in a data file called "netlist". In response, the place-and-route CAD tool outputs a circuit layout.

Using the computer layout generated as a blueprint, a number of base, contact, and metal layers defining the elements and interconnections of the VLSI circuit are created in silicon through a combination of semiconductor processes namely depositing, masking, and etching. When combined, these layers form the VLSI circuit. Depending on the complexity of the application specific VLSI circuit, each circuit may involve multiple base layers, multiple contact, and multiple metal layers. This process is widely known as tape-out.

Following tape-out, for various reasons including design changes, modifications are subsequently required to delete as well as add logic elements and interconnections from the VLSI circuit. When this occurs, an engineering change order (ECO) is generated to document the desired changes. Next, the circuit layout generated earlier is modified using the commercial place-and-route CAD tool to incorporate the desired changes. Under the prior art, extra logic cells of different types are included in the original computer layout as reserves in case new elements are needed. However, due to limitations inherent in the software environment (e.g., capability to handle a limited number of variables), the place-and-route CAD tool requires that these extra logic cells be of predefined types and numbers. Because the types of the logic cells are predefined as AND gates, OR gates, flip-flops, etch, modifications are limited to changing the logic cells connectivity. Such inflexibility may cause disastrous consequences. For example, in adding logic elements as required under an ECO, a logic cell of a certain type may not be available for implementing a desired function. As a result, either the desired function must be deleted or the process of generating a computer layout with the desired logic cells must be restarted. As such, neither one of these options are desirable.

Even if the right type logic cells are available for adding, the layout engineer must still make the proper connections. Because the locations of the logic cells are fixed, it is sometimes not possible to provide the desired connections given existing obstacles and various space constraints in the layout. In addition, it is a painful and time consuming task to identify the extra logic cells and provide the proper wiring to properly connect the added cells. Because of the increasing complexity of VLSI circuits, the layout engineer must work with as many as four different layout layers at a time. Given the complexity of the task, under the prior art, the turn-around time to incorporate the desired ECO changes is generally high. Hence, it is desirable to preserve as much of the information generated from the original layout as possible as well as to automate the ECO process to allow ECO changes to be made faster and more efficiently.

In automating the ECO process, net connectivity patterns for configuring logic cells to implement logic functions such as ANDing, ORing, etc. are gathered and stored as a standard cell library. Using the net connectivity patterns in a cell library, a place-and-route CAD tool can automatically configure standard cells on a VLSI circuit layout to perform the desired functions. In so doing, VLSI circuits having the intended logic functions can be fabricated in a short time because the logic cell configuration is made automatically by computers instead of manually by layout engineers.

For application specific integrated circuits (ASIC), there are two major types of logic cells: standard logic cells and gate array cells. For standard logic cells, each logic function is implemented essentially as a custom designed circuit which can be placed anywhere in a circuit layout and then wired to other functions, circuits, or cells. In addition to having optimized performances, the sizes of the devices or transistors in standard logic cells are minimized to save space. As such, once configured, modifications of standard cells can be made by making new mask for every step in the fabrication process starting from the silicon wafer.

Unlike standard cells, gate array cells can be configured to implement the desired functionality by making the required interconnections in the metal layers of the integrated circuits. This is allowed because for gate array cells, any logic function is implemented with the same set of devices or transistors. Accordingly, both initial designs and later modifications of integrated circuits can be made faster and less expensive using gate array cells than using standard cells albeit at great costs in performance and density.

Due to the fundamental difference between standard cells and gate array cells, net connectivity patterns in a standard cell library are not generally applicable to gate array cells. Similarly, net connectivity patterns in a gate array cell library are not generally applicable to standard cells. For various reasons, commercial place-and-route CAD tools, however, generally require that the net connectivity patterns in a gate array cell library be designed for standard logic cells. As such, a VLSI circuit initially designed using standard logic cells and having spare gate array cells for ECO modifications cannot use the standard cell library to automatically configure the spare gate array cells.

Thus, a need exists for a method and system to allow using the net connectivity patterns in a standard cell library to automatically configure gate array cells.

SUMMARY OF THE INVENTION

Accordingly, the present invention provides a system, and method to allow a standard cell library to be used to automatically configure gate array cells.

The present invention meets the above need with a computer system adapted to use a standard cell function library to configure gate array cells in an integrated circuit layout. The computer system comprises a bus, a central processor connected to the bus, and memory connected to the bus.

The memory stores instruction codes which when executed by the central processor compile a standard cell netlist at a transistor level. Based on the standard cell netlist compiled, the executed instruction codes define gate array structures such that they can be inserted in locations for standard cells. Next, the executed instruction codes place the gate array structures in desired locations in a layout. The executed instruction codes route the gate array structures placed according to net connectivity patterns from the standard cell function library to implement desired logic functions.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
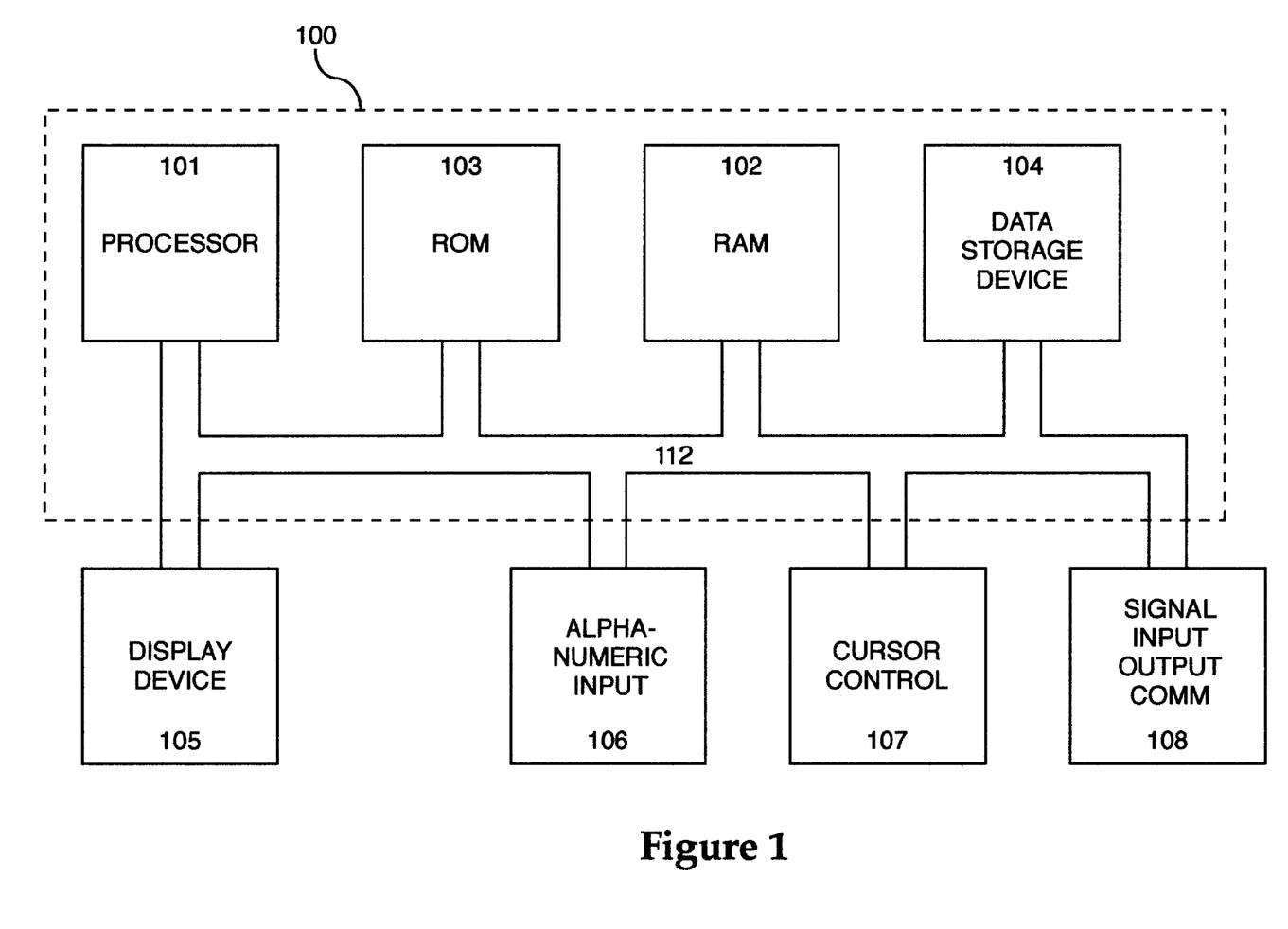
FIG. 1 is a block diagram illustrating a computer system that implements the CAD tools in accordance with the invention to implement ECO modifications in an integrated circuit layout having configurable gate array cells.

Reference is made to FIG. 1 illustrating a block diagram of computer system 100 upon which the present invention may be implemented or practiced. It is to be appreciated that computer system 112 is exemplary only and that the present invention can operate within a number of different computer systems including general purpose computers systems, embedded computer systems, and computer systems specially adapted for electronic design automation. In the following discussions of the present invention, certain processes and steps that are realized as a series of instructions (e.g., software program) that reside within computer readable memory units of system 100 and executed by processors of system 100.

In general, computer system 100 used by the present invention comprises address/data bus 112 for conveying information and instructions, one or more processors 101 coupled with bus 112 for processing information and instructions, a random access memory (RAM) 102 for storing digital information and instructions, a read only memory (ROM) 103 for storing information and instructions of a more permanent nature. In addition, computer system 100 may also include a data storage device 104 (e.g., a magnetic, optical, floppy, or tape drive) for storing vast amounts of data, and an I/O interface 108 for interfacing with peripheral devices (e.g., computer network, modem, etc.). Moreover, computer system 100 may include a display device 105 for displaying information to a computer user, an alphanumeric input device 106 (e.g., keyboard), and a cursor control device 107 (e.g., mouse, trackball, lightpen, etc.) for communicating user input information and command selections.

Figure 2:
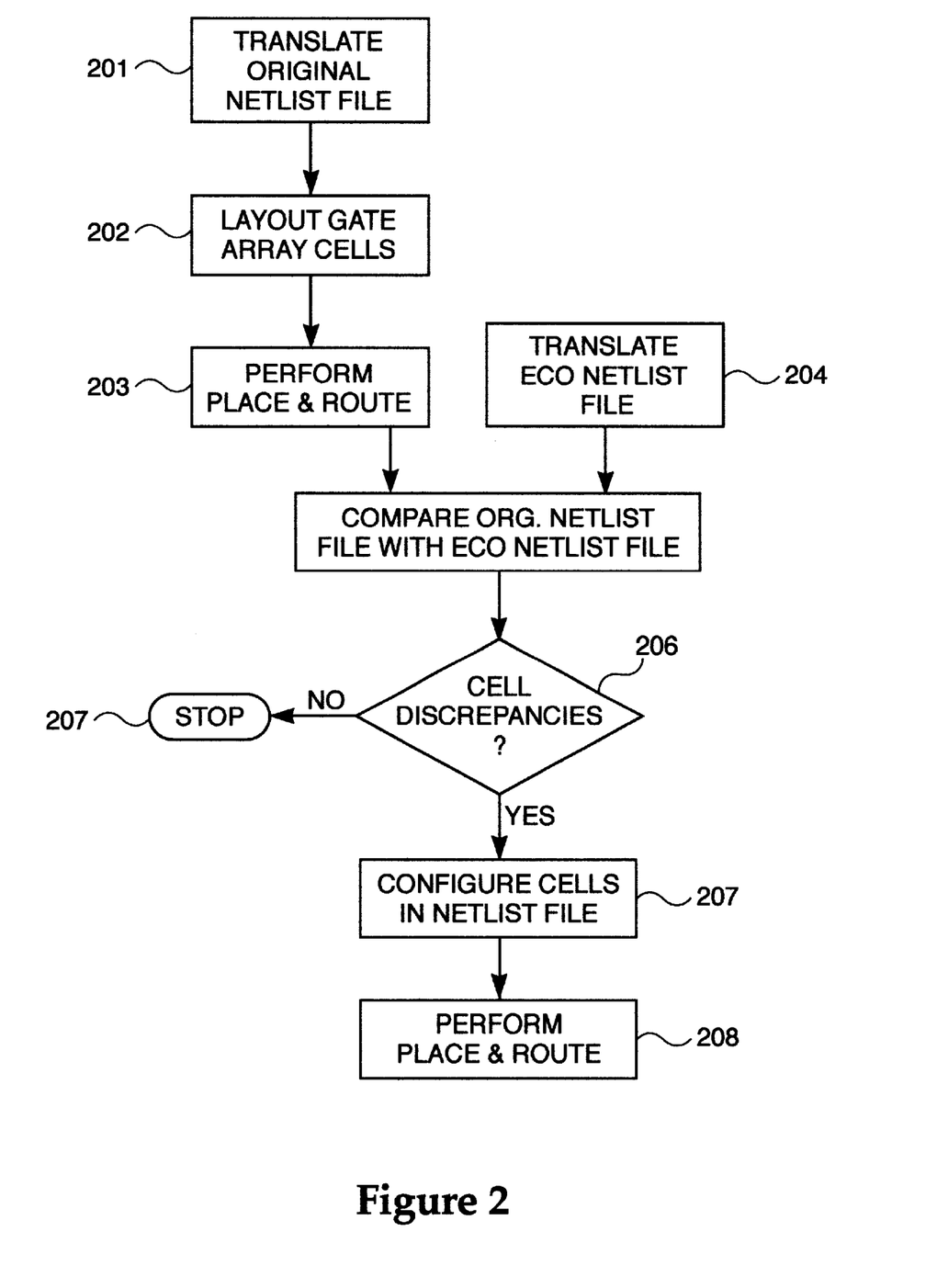
FIG. 2 is a flow chart illustrating the high-level process steps involved in incorporating ECO changes in according with the present invention.

FIG. 2 is a flow chart illustrating the high-level steps involved in incorporating ECO changes in accordance with the present invention. These high-level steps provide an overall picture of the present invention. More detailed description of these steps are provided in association with subsequent figures below. In step 201, a netlist data file is formatted to work with the place-and-route CAD tool selected. At this point, the netlist data file contains a description of sets of terminals that must be interconnected.

Preferably, the net list data file is formatted to the design exchange format (DEF) for place-and-route CAD tool Cell3™, a maze-based router, from Cadence Design Systems, Inc., of San Jose, Calif. Next, through user interaction, power pads, ground pads, corner cells, gap cells, and gate array cells are added to the formatted original netlist in step 202. In doing so, a layout of the VLSI circuit is created.

Using the formatted netlist as input, place-and-route CAD tool Cell3™ is used to determine the routing, placing, wiring, interconnections and general layout of the VLSI circuit (step 203). In general, connections between gate array cells and other standard cells are made by place-and-route CAD tool Cell3™ according to the description provided in the original netlist file. All these information are then saved as part of the formatted netlist file (hereinafter "the original netlist file"). The gate array cells used in the present invention are basically floating transistors which can be manually derived from standard commercial logic cells by modifying the existing connections. The floating transistors of these modified standard logic cells can then be configured to provide any desired function by making the appropriate connections in the corresponding metal layer. Although discussed here, steps 201–203 are likely performed in advance to generate the original layout used in the first tape-out. Hence, for the sake of efficiency, the original layout can be used over again in incorporating ECO changes.

In response to an ECO, the desired changes (e.g., terminal connections) are compiled in an ECO netlist file which also contains descriptions of sets of terminal connections to be made. The ECO netlist file is also formatted for place-and-route CAD tool Cell3™ (step 204). The original netlist file is compared against the ECO netlist file to determine the changes to be made (step 204). More particularly, step 204 determines whether there are any cell discrepancy between the original netlist file and the ECO netlist file. If any cell discrepancy is detected indicating modifications are required, the wiring in the corresponding metal layer are modified accordingly to reconfigure the selected gate array cells to provide the desired functionality (e.g., as ANDing, an ORing, etc.) (step 207). The base layers are therefore preserved. The ECO netlist file and the original netlist file are merged. The merged netlist file is provided as input to place-and-route CAD tool Cell3™ to determine the new routing, placing, wiring, interconnections and general layout of the VLSI circuit (step 208). Place-and-route C-AD tool Cell3™ then outputs a new layout of the VLSI circuit. Hence, most of the information generated from the previous layout is saved and reused. In the unlikely event that no cell discrepancy is detected, no modification is required in the original netlist file.

Figure 3:
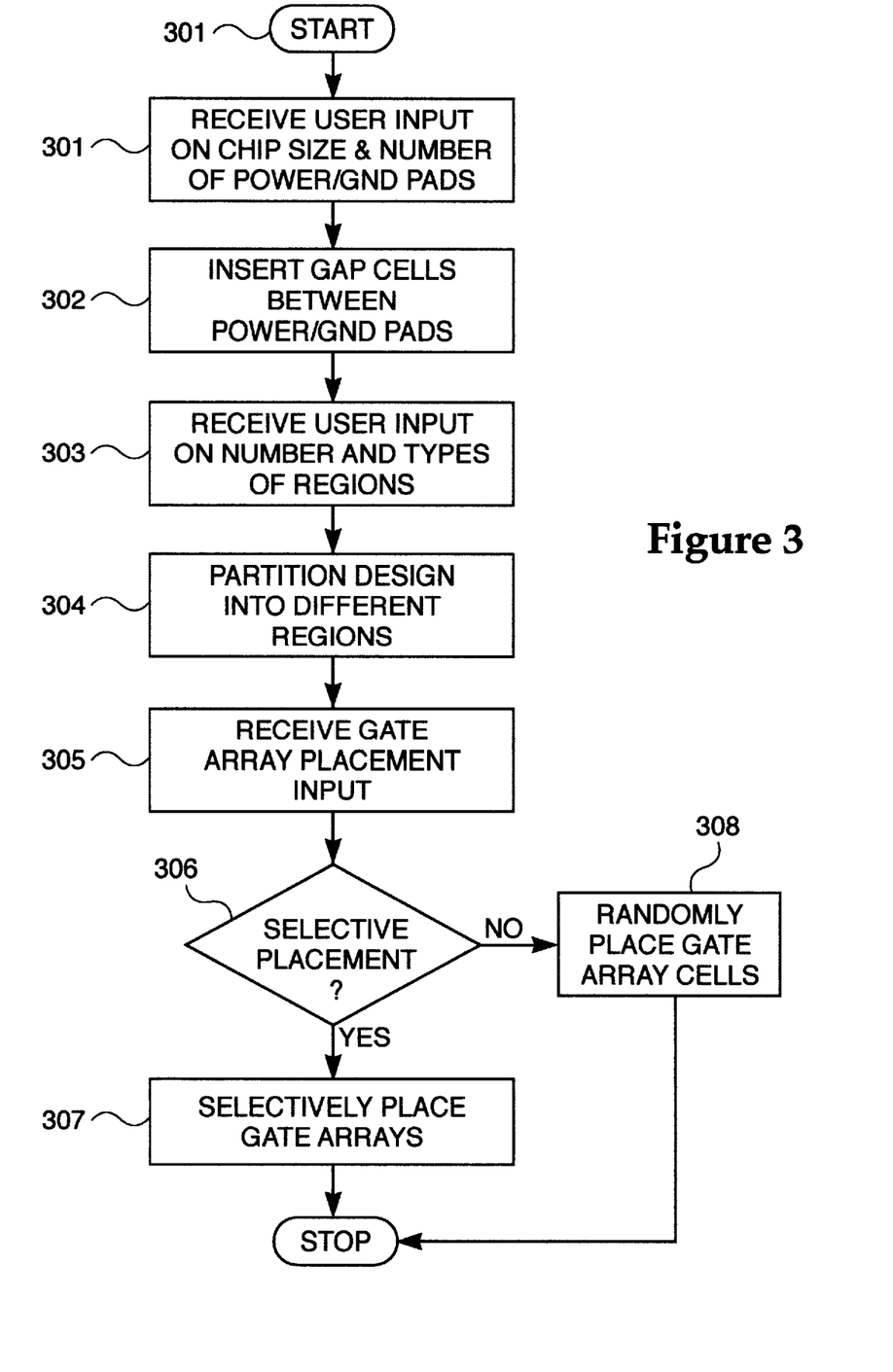
FIG. 3 is a flow chart illustrating the steps of the CAD tool used in generating a layout of the gate array cells in an application specific VLSI circuit in accordance with FIG. 2.

Reference is now made to FIG. 3 illustrating a flow chart of the instruction codes stored in memory of computer system 100 which when executed by processor 101 generates a layout of the array cells as indicated in step 202 of FIG. 2. In step 301, data regarding the chip size and numbers of the power and ground pads are interactively received from the user. By knowing the chip size and the number of the power/ground pads, the power/ground pads can be arranged on the periphery of the chip accordingly. In doing so, the number of gap cells required to fill the gaps around the chip periphery can be determined. The gap cells are then inserted between the power/ground pads in step 302. Four corner cells are placed automatically at the four corners of the layout. Next, data on the number and types of regions are received interactively from the user in step 303. The chip surface area is organized into different regions according to the user input (step 304).

In the preferred embodiment, a user can choose between selective placement of gate array cells or random placement of gate arrays. In selective placement, the user can dictate where gate arrays are to be placed in the layout. More particularly, a user can select the sites/regions by pointing to a site and specifying to the computer the number of gate array cells to be added. On the other hand, in random placement of gate arrays, upon specifying the number of gate array cells to be added, the computer randomly distributes the added gate array cells across the layout according to a predetermined scheme. Placement of gate array cells is performed interactively. In step 305, the gate array placement input is received from the user. If placement of gate array cells is to be done selectively (step 306), further user input including number of gate array cells to be added and locations are expected before placements are carried out as discussed earlier (step 307). If placement of gate array cells is to be done randomly, further user input of the number of gate array cells to be added is expected before they are distributed randomly (step 308). The gate arrays cells inserted can be monitored using a data base linked to the netlist.

Figure 4:
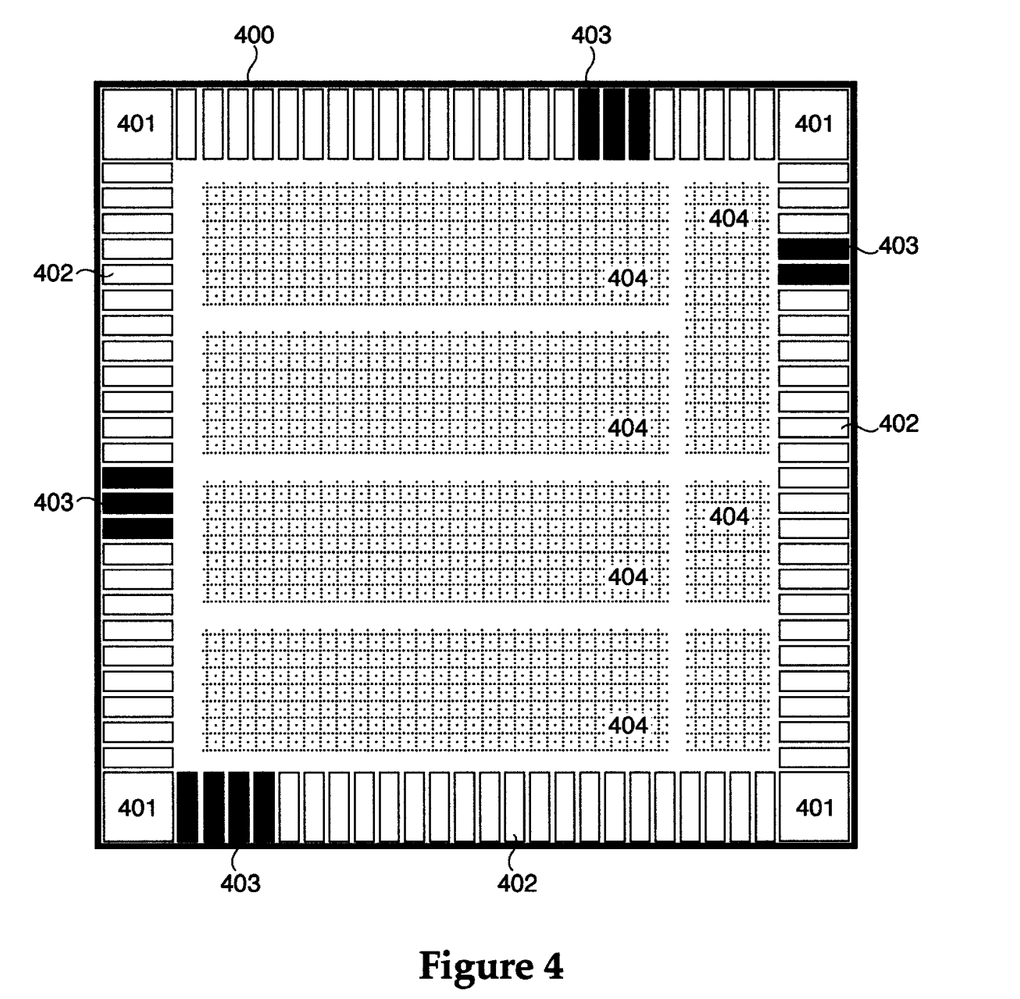
FIG. 4 illustrates an exemplary layout of a VLSI circuit generated by the CAD tool of FIG. 3.

An exemplary VLSI circuit layout generated by the flow chart in FIG. 3 is illustrated in FIG. 4. As shown in FIG. 4 a number of power/ground pads 402 in accordance with the user input are arranged along the periphery of VLSI circuit 400. Four corner cells 401 are placed at the four corners of the circuit layout. Gap cells 403 are inserted as necessary along the periphery to fill the gaps between power/ground pads 420. As further illustrated in FIG. 4, for design purposes the VLSI circuit is also divided into different regions 404. Each region 404 consist of a matrix of rows and columns of gate array cells. Gate array cells to be added in the layout are inserted into the rows of regions 404. Connectivity between the regions, the pads, and gate array cells is made by using wiring patterns on metal layers that overlays the layout shown in FIG. 4. Moreover, connectivity among the gate array cells to configure the cells to provide a desired function (e.g., as an AND-gate, a flip-flop, etc.) can also be made by introducing wiring patterns on the metal layers.

Figure 5:
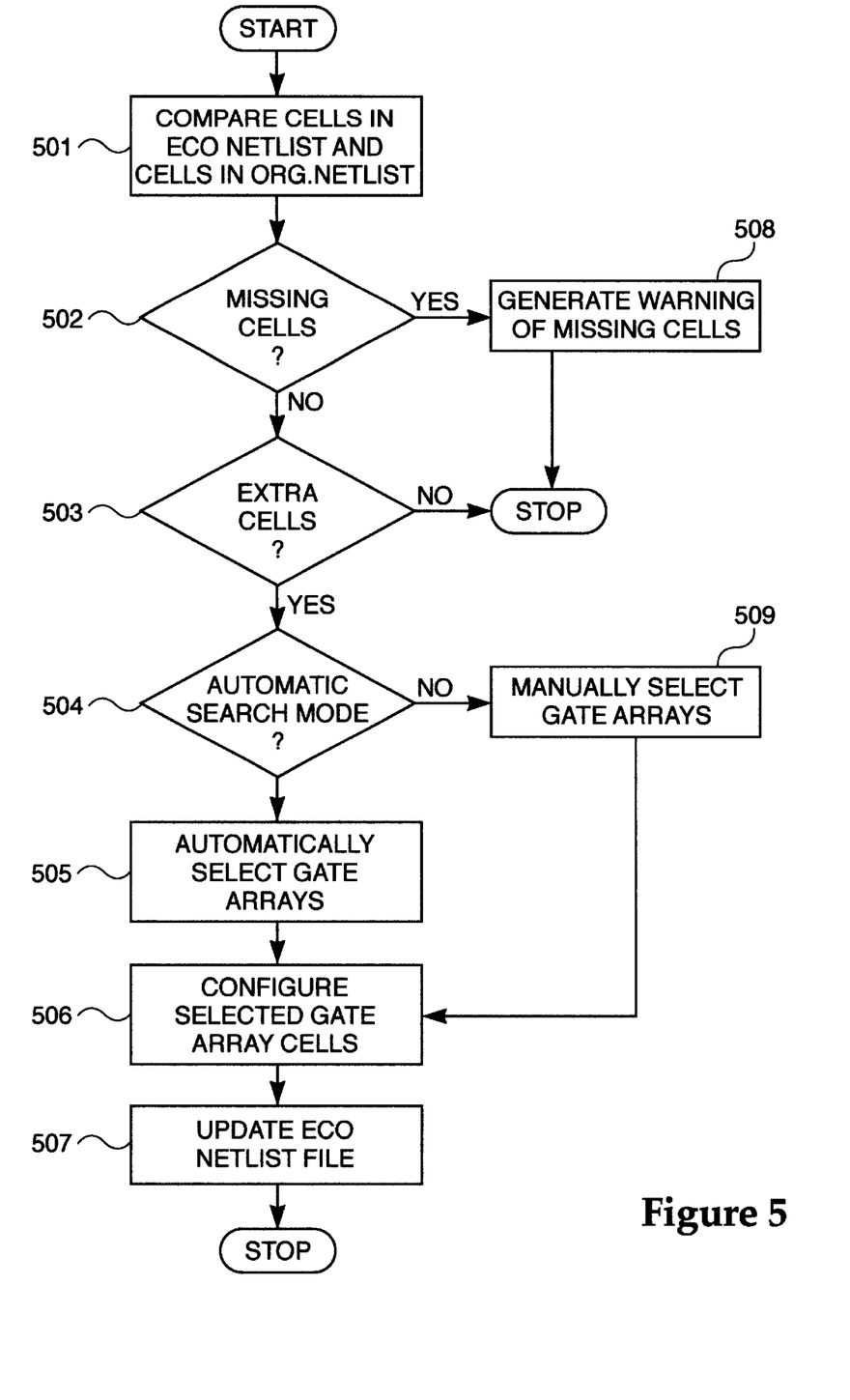
FIG. 5 is a flow chart illustrating the steps of the CAD tool used in selecting gate array cells and reconfiguring them in accordance with FIG. 2.

Referring now to FIG. 5 illustrating a flow chart of the instruction codes stored in memory of computer system 100 which when executed by processor 101 helps to determine whether or not there are any cell discrepancies between the original netlist file and the ECO netlist file and to reconfigure the gate array cells as needed to incorporate the desired ECO changes. In step 501, the ECO net list file is compared against the original netlist file In particular, the sets of terminal connections from the ECO netlist file are compared against that of the original net list file. The clues from the terminal connection differences may indicate whether there are gate array cells missing in the ECO netlist file or whether there are extra gate array cells in the ECO netlist file. More specifically, the ECO netlist file is missing cells when the original netlist file utilizes the cells but the ECO netlist file does not. On the other hand, the ECO netlist file contains some extra cells when the it utilizes the cells but the original netlist file does not.

If it is determined that there are some missing cells (step 502), a warning is generated to the user (step 508). When there are some missing cells, some cells have probably been deleted inadvertently and the user needs to double check. If there are no missing cells, it is determined whether the ECO netlist file contains some extra cells (step 503). In the unlikely event that the ECO netlist file also does not contain any extra cells, there is either no cell discrepancies or the ECO modifications only involve connectivity change. When this occurs, the software program is stopped. On the other hand, if it is determined that the ECO netlist file contains some extra cells, steps are taken to reconfigure some cells to provide the desired functions. This is because a determination of extra cells indicates that additional logic functions are required to be implemented by the ECO. The extra cells detected by step 501 and their desired functionality are compiled into a list which is monitored to ensure that the required reconfigurations are carried out.

To help select the most ideal gate array cells to reconfigure, both an automatic search mode and an manual search mode are available in the preferred embodiment. As discussed earlier, gate array cells can be reconfigured by modifying the net connections in the metal layers. As such, gate array cells that locate closest to the geometry center of the cells that are connected by the same net as the cells to be reconfigured are most ideal for reconfiguration. This is the search criteria used for the search algorithm employed in the search mode. As an example, assuming the ECO requires a flip-flop to be implemented, gate array cells that are closest to the geometry center of all the cells sharing the same net as the flip-flop are located. It should be clear to a person of ordinary skill in the art that other search criteria can be used in the search algorithm employed in the search mode. At times, however, limitations may render an automate search inefficient in locating ideal gate array cells for reconfiguration. For example, when some cells that are connected by the same net as the gate array cells are also to be reconfigured later, it is not possible to find the geometry center. The manual select mode is provided to allow user to visually select gate array cells.

As such, in step 504, the program determines whether the user selects the automatic or the manual search mode. The user selection is provided interactively to computer system 100. If the automatic search mode is selected, the search engine scans the data base to look for gate array cells that meet the search criteria discussed above (step 505). In the automatic search mode, information regarding the type of gate array cells (e.g., a flip-flop, an AND gates etch) to be implemented is automatically provided by monitoring the list storing the extra cells and their desired functionality. On the other hand, if the manual search mode is selected, the user manually selects the desired select gate array cells by drawing a box to surround these cells (step 509). The user is then required to provide as input the type of cell to be implemented. In response, a dialog window pops up to ask the user to confirm the type of cell (erg., a flip-flop, an AND gate, etc.).

Upon selecting the gate array cells to be reconfigured, whether through the automatic or manual search mode, the gate array cells selected are reconfigured to change their functionality by modifying the net wiring pattern for the gate array cells selected. The ECO netlist file which contains the wiring instructions for the reconfigured gate array cells is later provided to the place-and-route CAD tool for reconfiguring the metal layers.

As illustration of how selected gate array cells are reconfigured, consider the following example which assumes that the ECO requires an additional flip-flop be implemented. Assume also that three gate array cells are required to make up a flip-flop. After three adjacent gate array cells (GATE_P_1, GATE_P_2, GATE_P_3) are selected, either by automatic search or manual search, the coordinate location of cell GATE_P_1 is recorded as the coordinate location of the flip-flop X_FL02 (i.e., gate array cells reconfigured to have the same functionality as a standard flip-flop cell FL02) to be created. The three gate array cells are deleted from the original netlist file and replaced with flip-flop X_FL02. The ECO netlist file is merged with the original netlist file and the merged file is provided to the place-and-route CAD tool.

The instruction codes for the CAD tools discussed above are included in the appendix. Additionally, the supporting instruction codes for the CAD tool such as header files (i.e., for definition, initialization, and support) and graphics user interface files to allow users to interact with the CAD tools are also include in the appendix.

Thus, FIGS. 1–5 illustrate a method and a system to implement ECO modifications in an integrated circuit layout having configurable gate array cells. On the other hand, FIGS. 6–12 illustrate the present invention for allowing a standard cell library to be used in automatically configuring gate array cells. As will be shown, some part of the invention illustrated in FIGS. 6–12 are similar to their counterparts in FIGS. 1–5 and like elements are so indicated by primed reference numbers. Where such similarities exist, the structure/elements of the invention of FIGS. 6–12 that are similar and/or function in a similar fashion as those in FIGS. 1–5 will not be described in detail again.

Figure 6:
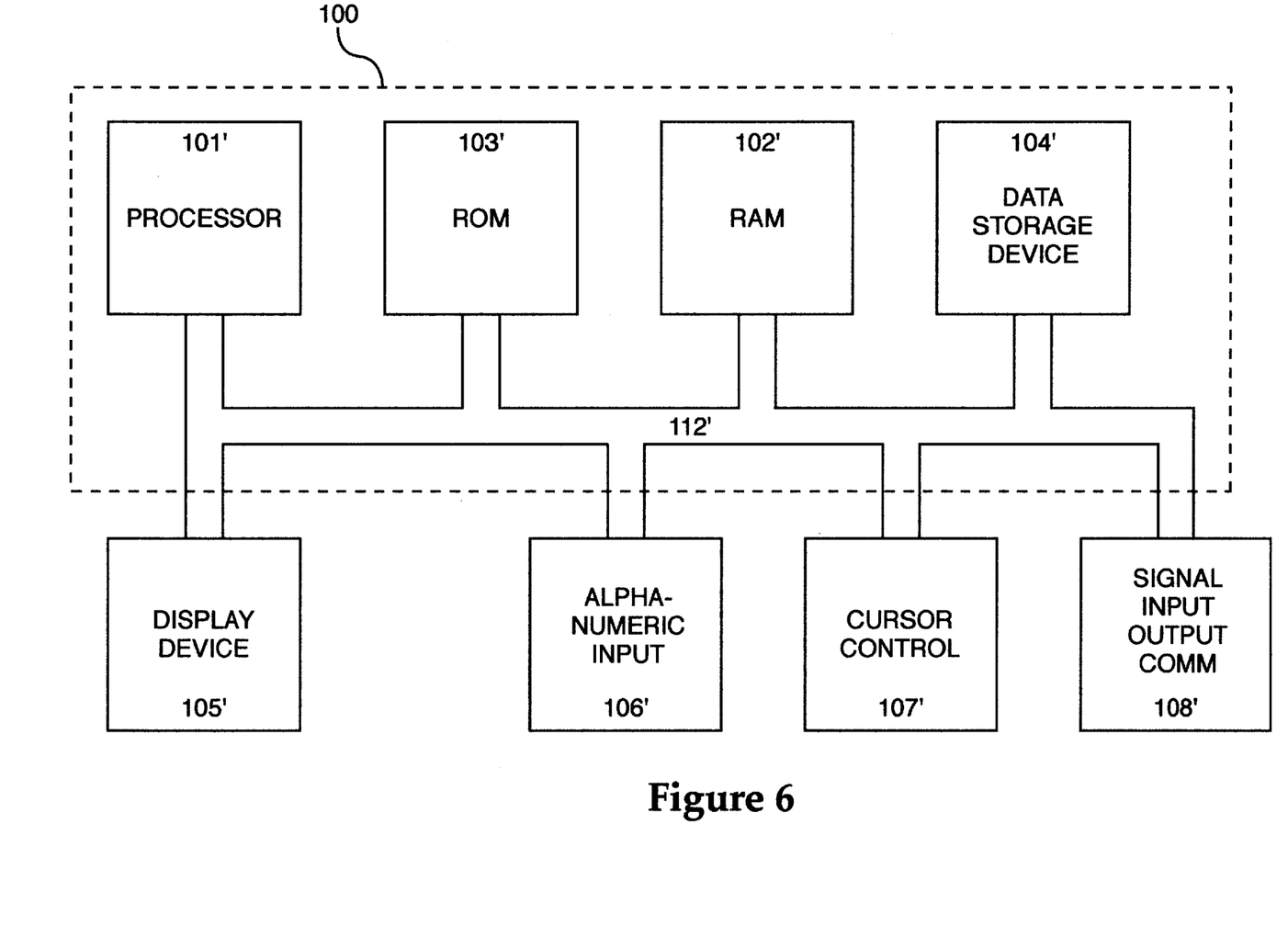
FIG. 6 is a block diagram illustrating a computer system that implements the CAD tools in accordance with the present invention for allowing a standard cell library to be used in automatically configuring gate array cells.

Reference is now made to FIG. 6 illustrating a block diagram of computer system 100' upon which the present invention may be implemented or practiced. It is to be appreciated that computer system 100' is exemplary only and that the present invention can operate within a number of different computer systems including general purpose computers systems, embedded computer systems, and computer systems specially adapted for electronic design automation. In the following discussions of the present invention, certain processes and steps that are realized as a series of instructions (e.g., software program) that reside within computer readable memory units of system 100 and executed by processors of system 100'.

In general, computer system 100' used by the present invention comprises address/data bus 112' for conveying information and instructions, one or more processors 101' coupled with bus 112' for processing information and instructions, a random access memory (RAM) 102' for storing digital information and instructions, a read only memory (ROM) 103' for storing information and instructions of a more permanent nature. In addition, computer system 100' may also include a data storage device 104' (e.g., a magnetic, optical, floppy, or tape drive) for storing vast amounts of data, and an I/O interface 108' for interfacing with peripheral devices (e.g., computer network, modem, etc.). Moreover, computer system 100' may include a display device 105' for displaying information to a computer user, an alphanumeric input device 106' (e.g., keyboard), and a cursor control device 107' (e.g., mouse, trackball, lightpen, etc.) for communicating user input information and command selections.

Figure 7:
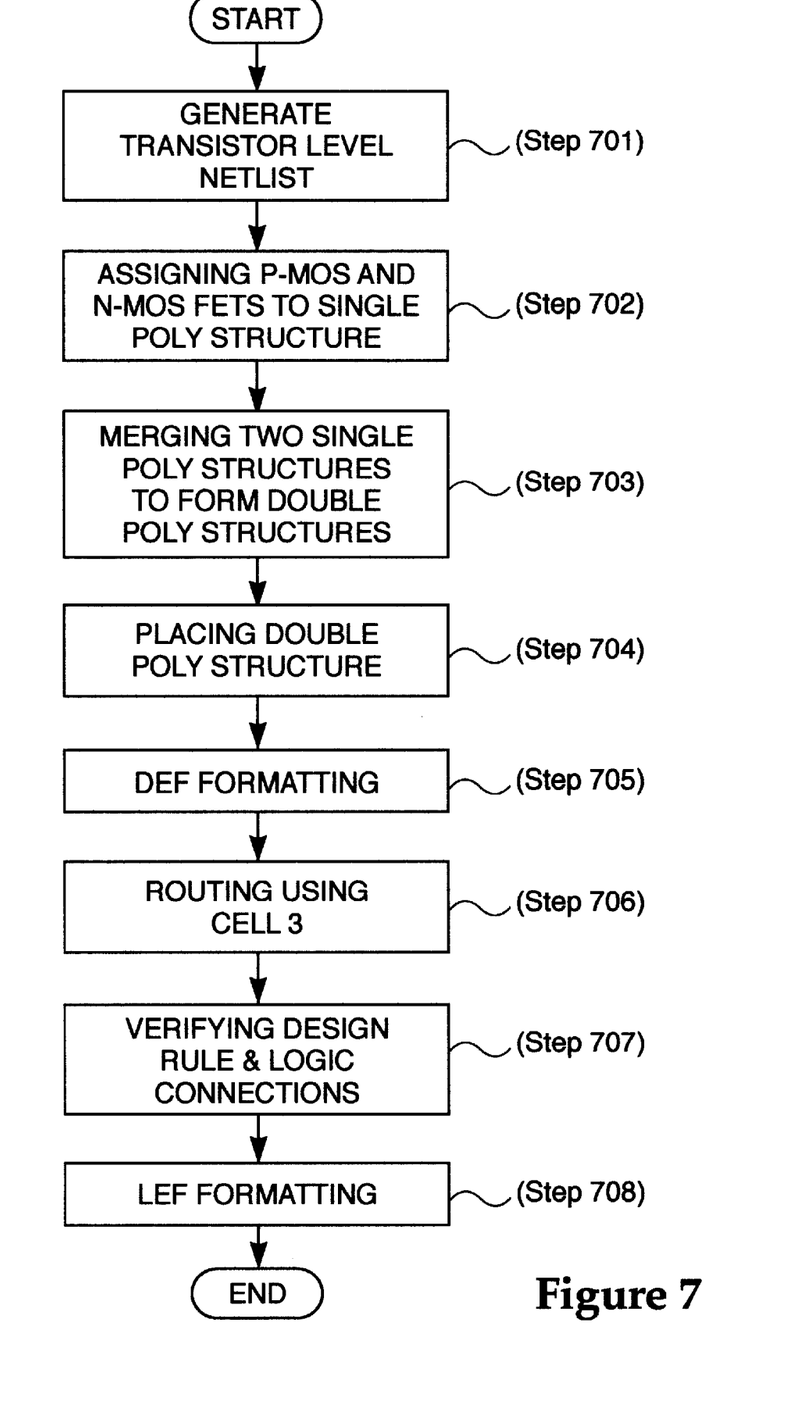
FIG. 7 is a flow chart illustrating the steps of the present invention to allow a standard cell library to be used in automatically configuring gate array cells.

FIG. 7 is a flow chart illustrating the steps involved in making the net connectivity patterns in a standard cell library applicable to gate array cells in accordance with the present invention. The steps in FIG. 7 are carried out when processor 101' executes the instruction codes stored in memory of computer system 100'. While the preferred operating mode of the present invention is in configuring spare gate array cells inserted for ECO modifications in a standard cell integrated circuit, it is to be appreciated that the present invention is not limited to this operating mode.

Instead, the present invention can be used to configure spare gate array cells in any context including for an initial design layout.

Figure 8:
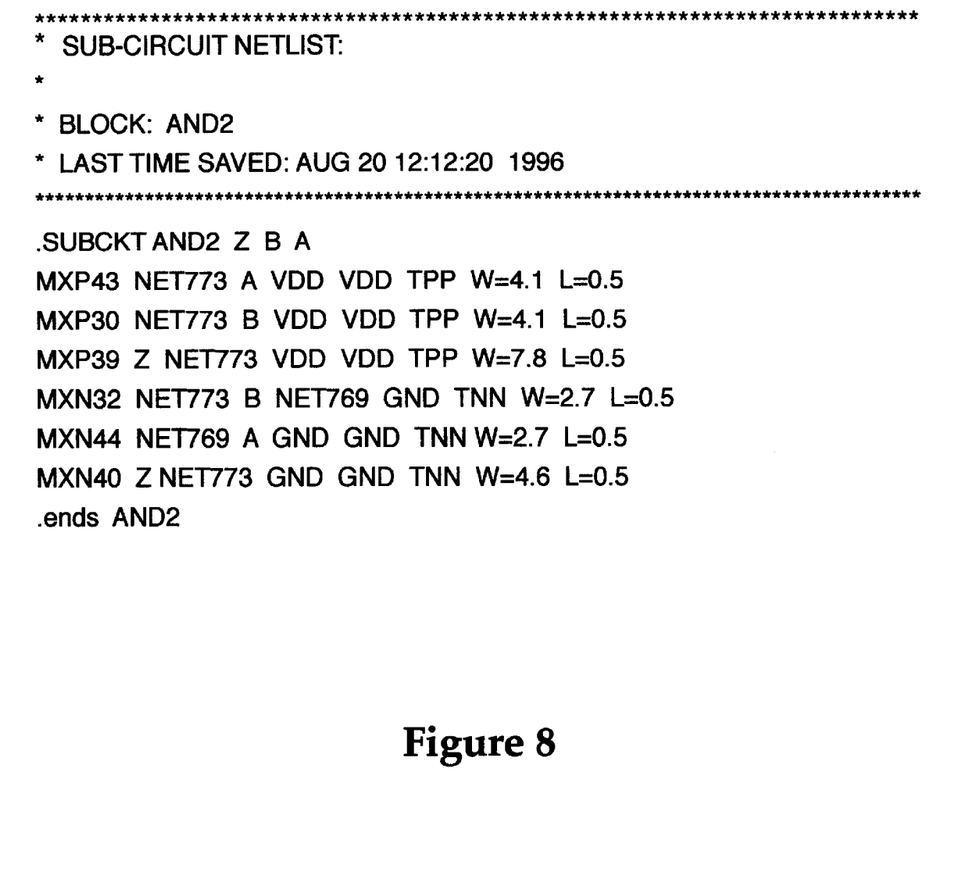
FIG. 8 illustrates, as an example, a transistor-level sub-circuit netlist.

In step 701, a standard cell netlist at the transistor level is created. The netlist provides a listing of the transistors and connectivity of these transistors for the spare gate array cells in the integrated circuit layout. In general, this standard cell netlist is generated using the SPICE netlist, which is a well-known simulation netlist type that is normally available from the schematic entry cell library. The SPICE netlist is preferably converted to a Design Exchange Format (DEF). The netlist further provides information on the transistors themselves such as the type of the transistor, the nodes to which the transistor's gate, source, and drain are connected, etc. FIG. 8 illustrates, as a example, a transistor-level netlist of an AND2 sub-circuit. The netlist got the entire VLSI is composed of many such sub-netlist. As shown in FIG. 8, each row provides information related to a transistor. The first column of the netlist shows the transistor number and its type. For example, P43 indicates that transistor number 43 is a p-mos FET. The second column shows the node that is connected to the source of the transistor, the third column shows the node that is connected to the gate of the transistor, and the fourth column shows the node that is connected to the gate of the transistor. The rest of the columns shows other transistor information such as connection to the substrate, length, and width that are not relevant to the present invention.

Figure 9:
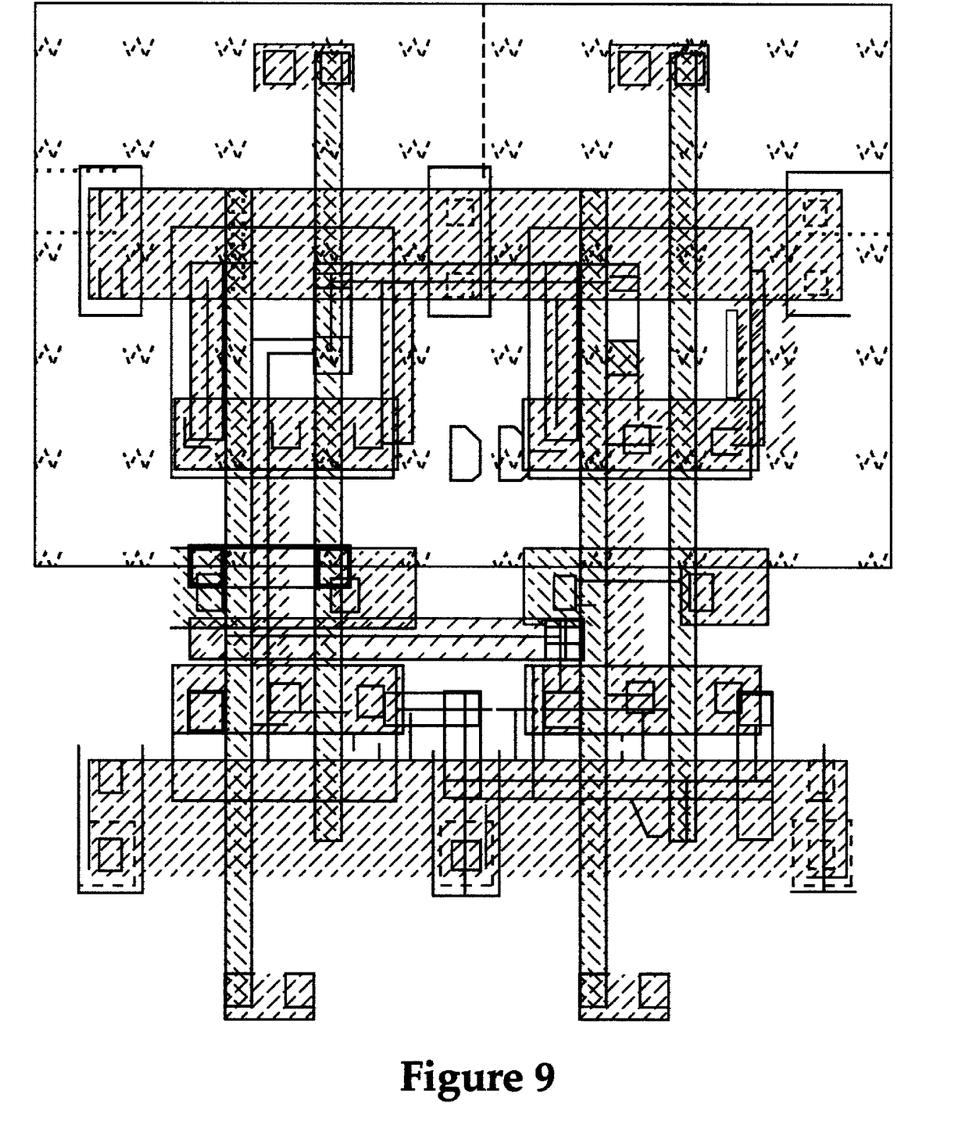
FIG. 9 illustrates, as an example, a gate array cell NAND gate with 2 inputs.
Figure 10:
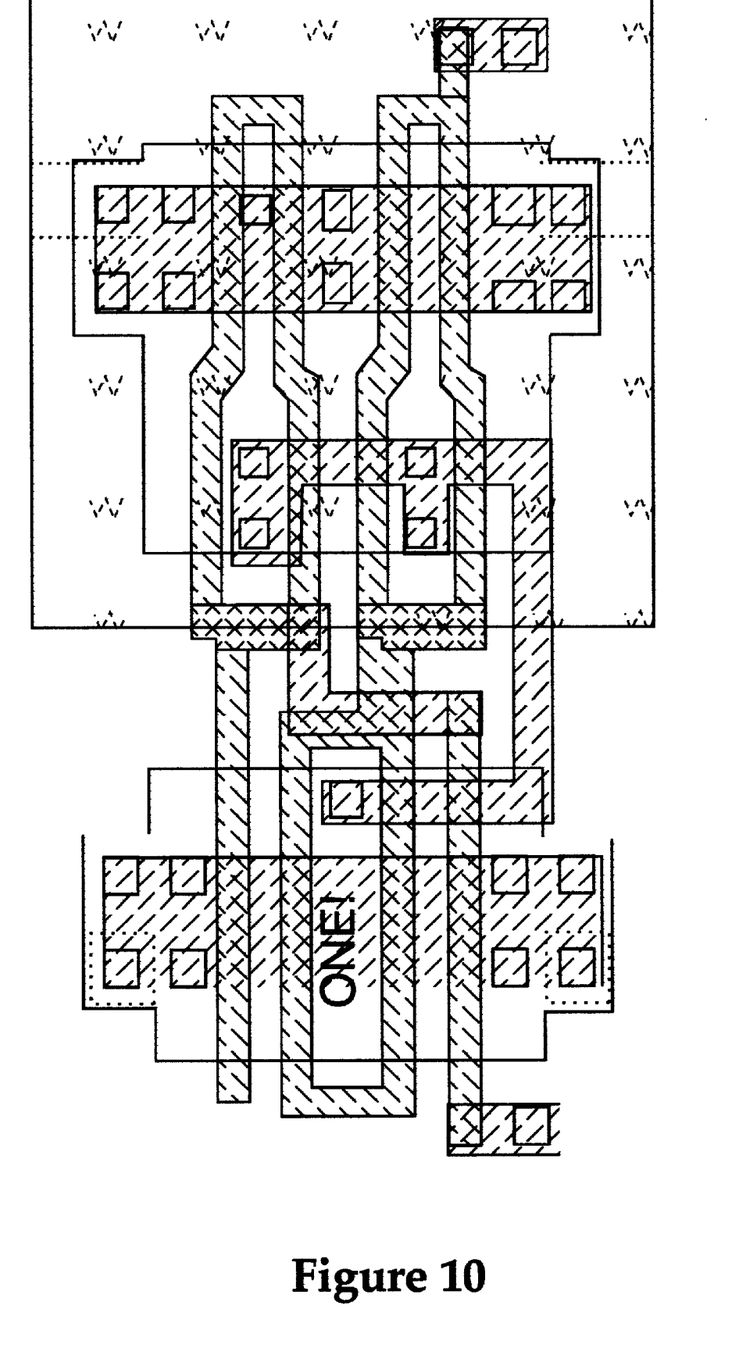
FIG. 10 illustrates, as an example, a standard cell NAND gate with 2 inputs.

Referring now to FIGS. 9 illustrating, as an example, a gate array cell NAND gate with two inputs. On the other hand, FIG. 10 illustrates, as an example, a standard cell NAND gate with two inputs. As illustrated in FIGS. 9 and 10, the gate array cell is approximately two times the size of the standard cell which is representative of the relative difference in size between a gate array cell and a standard cell. Thus, to make the net connection logic function patterns in a standard cell library applicable to gate array cells, it is desirable to reduce the size of gate array cells to substantially that of standard cells. It is also desirable that the gate array cells have the same terminal nodes as that of standard cells. Under the present invention, the transistors of the spare gate array cells in the VLSI circuit layout are first assigned into single poly structures which are then merged into double poly structures. In so doing, transistors in gate array cells are restructured into double poly structures which have substantially the same size and terminal nodes as that of standard cells. As such, net connectivity patterns for different logic functions from the standard cell library can be used to configured the double poly structures created.

The instruction codes stored in memory of computer system 100' is designed to carry out the general rule above. In step 702, when the instruction codes are executed by processor 101', information from the netlist generated in step 701 is used to select a p-mos FET and an n-mos FET to create a single poly structure. In other words, information in the database is updated to indicate that two particular transistors belong to a particular single poly structure. In general, two transistors (a p-mos FET and an n-mos FET) are combined to form a single poly structure. A p-mos FET and an n-mos FET are assigned to a single poly structure according to the following criteria:

1. A p-mos FET and an n-mos FET are assigned to a single poly structure if and only if they have the same gate connection node (same gated) regardless of whether they share the same source or drain connection node.
2. An "dummy" p-mos FET is assigned to a single poly structure with an unmatched (odd) n-mos FET. An n-mos FET becomes unmatched if a same gated p-mos FET cannot be found. However, while the gate of the extra (a.k.a dummy) p-mos FET is connected to the gate of the unmatched (odd) n-mos FET, the source and drain of the dummy p-mos FET are tied to a power source. Similarly, an dummy n-mos FET is assigned to a single poly structure with an unmatched p-mos FET (i.e., a p-mos FET is unmatched if a same gated n-mos FET cannot be found). However, while the gate of the extra n-mos FET is connected to the gate of the unmatched (odd) p-mos FET, the source and drain of the dummy n-mos FET are tied to a ground source. In general, dummy transistors are inserted one at a time as needed upon reconfiguring the existing database.

Figure 11:
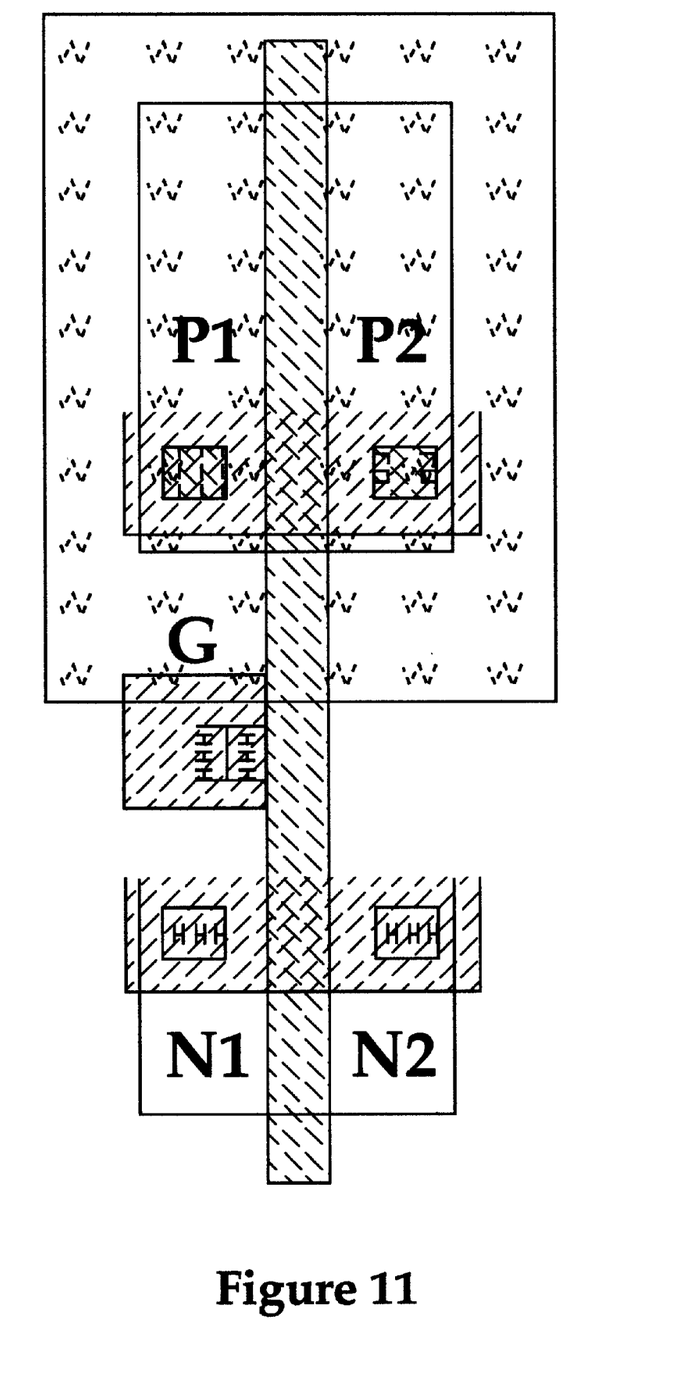
FIG. 11 illustrates as an example, a single poly structure in accordance with the present invention.

In so doing, a single poly structure such as the one illustrated, as an example, in FIG. 11 is created. As shown in FIG. 11, a typical single poly structure in accordance to the present invention has five nodes: P1 (source of p-mos FET), P2 (drain of p-mos FET), G (shared gate of p-mos FET and n-mos FET), N1 (source of n-mos FET), N2 (drain of n-mos FET). Processor 101' carries out step 702 until all the transistors from the gate array cells are assigned to single poly structures.

After the single poly structures are created, double poly structures are created by selectively merging two single poly structures together in step 703 using information from the netlist generated in step 701. Generally, two adjacent single poly structures are selected for merging into a double poly structure. A double poly structure is created by updating information in a database to indicate that two particular single poly structures belong to a particular double poly structure. Two single poly structures are merged together to create a double poly structures according to the following rules:

1. Two single poly structures are merged together if the sources of the p-mos FETs from two single poly structures share the same connection node.
2. Two single poly structures are merged together if the drains of the p-mos FETs from two single poly structures share the same connection node.
3. Two single poly structures are merged together if the sources of the n-mos FETs from two single poly structures share the same connection node.
4. Two single poly structures are merged together if the drains of the n-mos FETs from two single poly structures share the same connection node.
5. A dummy single poly structure is merged with an unmatched single poly structure. However, the source and drain of the p-mos FET should be tied together to disable current flow. Similarly, the source and drain of the n-mos FET should be tied together to disable current flow.

Figure 12:
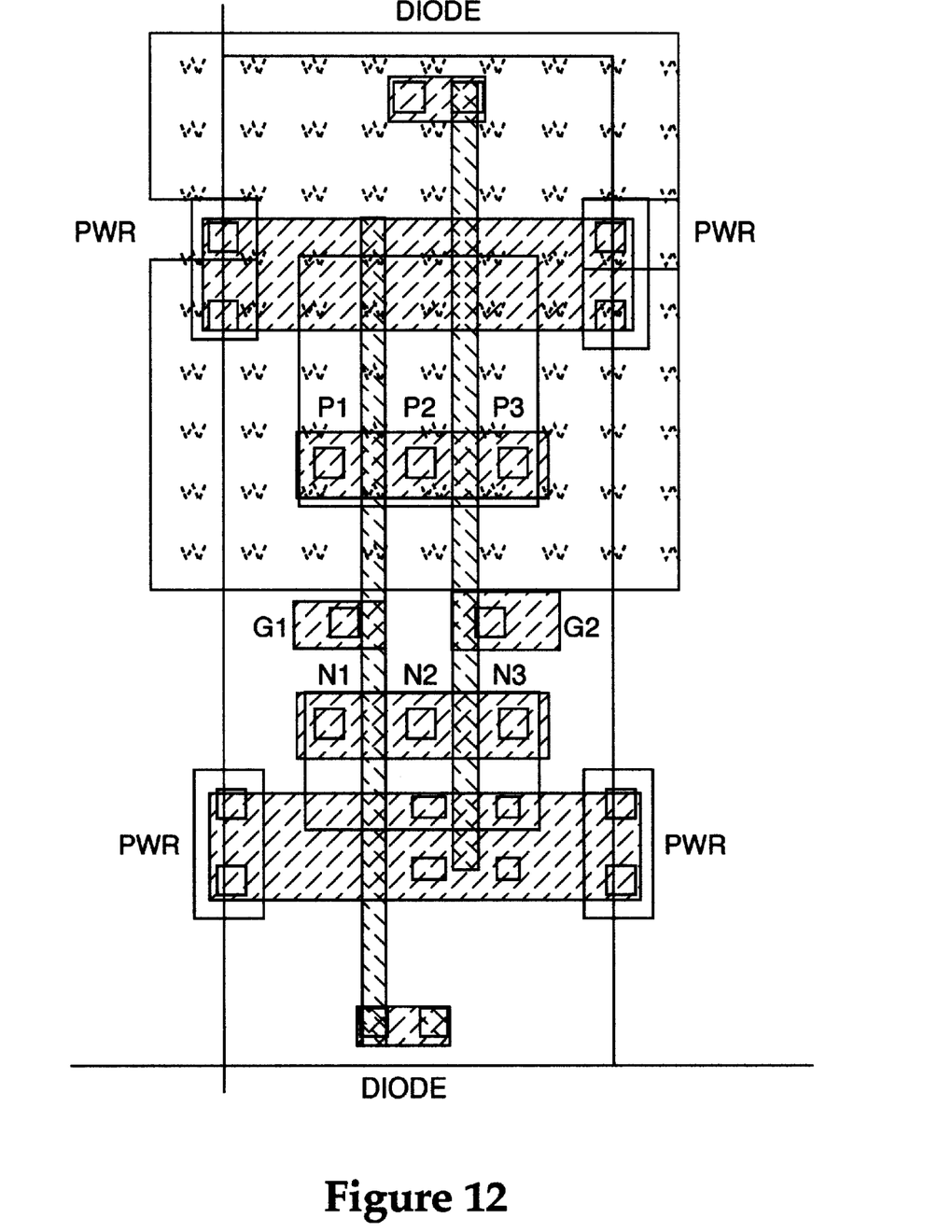
FIG. 12 illustrates, as an example, a double poly structure in accordance with the present invention.

In so doing, a double poly structure such as the one illustrated, as an example, in FIG. 12 is created. As shown in FIG. 12, a typical double poly structure in accordance to the present invention is a combination of two single poly structures that share a common transistor source and a common transistor drain. A double poly structure is made up of four transistors (two n-mos FET and two p-mos FET). The double poly structure has four power nodes Pr1–Pr4 that are used to power or ground the structure, two diode nodes, and eight terminal nodes consisting of P1 (source of first p-mos FET) P2 (shared drain of p-mos FETS), P3 (source of second p-mos FET), G1 (shared gate of first p-mos FET and, first n-mos FET), G2 (shared gate of second p-mos FET and second n-mos FET), N1 (source of first n-mos FET), N2

(shared drain of n-mos FETs), and N3 (source of second n-mos FET. By sharing a drain and a source node, the double poly structure takes up less space and requires fewer number of terminal nodes. Processor 101' carries out step 703 until all single poly structures are paired up and merged into double poly structures.

After all the double poly structures are constructed, the instruction codes stored in memory of computer system 100' is used to place the double poly structures in the VLSI layout in step 704. In carrying out step 704, the placement algorithm stored in memory of computer system 100' is designed to reduce the placement cost. Under this placement algorithm, placement cost is measured by net routing length and routability. Net routing length is the total connection length required between the terminals of the double poly structure and from the terminals of the current double poly structure to other poly structures. In reducing the connection length required, the placement order of the transistors inside the current double poly structure is changed around. As an example, assume the two n-mos FETs are numbered 1 and 2 and the two p-mos FETs are numbered 3 and 4. By placing the transistors, for example, in the order of 2134 (instead of 1234), the connection/routing length may be optimized. Thus, the placement algorithm will perform the necessary computation to determine the connection lengths for all permutations before deciding the desirable placement order for the transistors of the double poly structures.

Additionally, the placement algorithm seeks to increase routability by reducing net cross talking. In general, the more connections required in connecting a double poly structure means that connections will likely criss-crossed each other. Such criss-crossing can make routing more difficult. Hence, to increase routability, the placement algorithm again resorts to changing the order of the transistors inside the current double poly structure to come up with the placement order wherein net cross talking is reduced. Hence, the placement algorithm will perform calculations to determine the placement order for the transistors of the double poly structure which results in the least amount of net crossing.

Upon determining the desirable placement order of the transistors of all the double poly structures, the result file is format to work with the place-and-route CAD tool selected. At this point, the result file contains information related to the placement order of the transistors of all double poly structures as well as all the net connections necessary (step 705). Preferably, the result file is formatted to the design exchange format (DEF) Next, in step 706, the DEF result file is provided as an input to a commercial router such as Cell3™, a maze-based router, from Cadence Design Systems, Inc., of San Jose, Calif. In response, Cell3™ uses the net connectivity patterns in the standard cell library to make the required net connections (e.g., configures) for the gate array cells. In short, Cell3™ generates a physical data layout. Preferably, the physical data layout is formatted to the Graphics Data System II (GDSII) format. The physical data layout generated is then verified in step 707 to ensure that design rules have been followed correctly and that the logic connections made are correct. Some of the exemplary verification approaches for step 707 include Layout Versus Schematic (LVS) and Design Rules Checker (DRC). If it is determined that all the design rules have been followed and the logic connections are correct, the physical data layout file in GDS format is converted to the layout exchange format (LEF) which can be used with place-and-route CAD tool Cell3™ to implement the ECO modifications (step 708).

The preferred embodiment of the present invention, a method and system to allow standard cell library to be used for gate array cells, is thus described. While the present invention has been described in particular embodiments, the present invention should not be construed as limited by such embodiments, but rather construed according to the below claims.

What is claimed is:

1. A method of using a standard cell function library to configure gate array cells in an integrated circuit layout, the method comprising the steps of:

compiling a standard cell netlist at a transistor level, defining, from the compiled standard cell netlist, at least one gate array cell having an equivalent functionality and connectivity of a corresponding standard cell, placing the at least one gate array cell in a corresponding location of a standard cell in a layout, and routing connections to the at least one placed modified gate array cell according to net connectivity patterns from the standard cell function library to implement predetermined logic functions.

2. The method of claim 1, wherein said step of defining at least one gate array cell comprises the steps of:

selectively assigning, from the standard cell netlist compiled, a p-mos FET transistor and an n-mos FET transistor to a gate array cell to form a single poly structure, repeating said step of selectively assigning until all p-mos FET and n-mos FET transistors in the standard cell netlist are assigned to a corresponding single poly structure, selectively merging two single poly structures together to form a double poly structure, and repeating said step of selectively merging until all single poly structures are merged into double poly structures.

3. The method of claim 2, wherein each single poly structure comprises:

a p-mos FET and an N-mos FET, the p-mos FET and n-mos FET each having a gate, a source, and a drain, the gates of the p-mos FET and n-mos FET being connecting together.

4. The method of claim 3, wherein said step of selectively assigning further comprises the steps of:

if a p-mos FET transistor and a n-mos FET transistor share a gate connection node, assigning the p-mos FET transistor and the n-mos FET transistor to a common single poly structure, if no p-mos FET transistor and no n-mos FET transistor share a gate connection node, assigning an extra p-mos FET transistor to join the n-mos FET transistor in a common single poly structure wherein a source and a gain of the extra p-mos FET transistor are tied to a power source, and if no p-mos FET transistor and no n-mos FET transistor share a gate connection node, assigning an extra n-mos FET transistor to join a selected p-mos FET transistor in a common single poly structure wherein a source and a gain of the extra n-mos FET transistor are tied to a ground source.

5. The method of claim 4, wherein said step of selectively merging comprises the steps of:

if a p-mos FET transistor from a first single poly structure and a p-mos FET transistor from a second single poly structure share a common source, the first and second single poly structures are merged together to form a double poly structure, if a p-mos FET transistor from a first single poly structure and a p-mos FET transistor from a second single poly structure share a common drain, the first and second single poly structures are merged together to form a double poly structure, if an n-mos FET transistor from a first single poly structure and an n-mos FET transistor from a second single poly structure share a common source, the first and second single poly structures are merged together to form a double poly structure, if an n-mos FET transistor from a first single poly structure and an n-mos FET transistor from a second single poly structure share a common drain, the first and second single poly structures are merged together to form a double poly structure, and if there is an unmatched single poly structure, an extra single poly structure are merged with the unmatched single poly structure to form a double poly structure wherein a source and a drain of the p-mos FET transistor and the n-mos FET transistor in the extra single poly structure are tied together.

6. The method of claim 1, wherein said step of placing the at least one of gate array cell is carried out to minimize placement and routing costs.

7. The method of claim 6, wherein placement cost comprises net routing length.

8. The method of claim 6, wherein placement cost comprises net cross-talking.

9. A computer system adapted to use a standard cell function library to configure gate array cells in an integrated circuit layout, the computer system comprising:
   at least one bus;
   a central processor connected to the at least one bus; and
   at least one memory connected to the bus, the at least one memory storing instruction codes,
   wherein the instruction codes, when executed by the central processor:
      compile a standard cell netlist at a transistor level,
      define, from the compiled standard cell netlist, at least one gate array cell having the equivalent functionality and connectivity of a corresponding standard cell,
   placing the at least one gate array cell in a corresponding location of a standard cell in a layout, and
   routing connections to the at least one placed gate array cell according to net connectivity patterns from the standard cell function library to implement predetermined logic functions.

10. The computer system in claim 9, wherein the instruction codes define gate array structures by the steps of:
   selectively assigning a p-mos FET transistor and an n-mos FET transistor to a gate array cell to form a single poly structure,
   repeating the step of selectively assigning until all p-mos FET and n-mos FET transistors in the standard cell netlist are assigned to a corresponding single poly structure,
   selectively merging two single poly structures together to form a double poly structure,
   repeating the step of selectively merging until all single poly structures are merged into double poly structures,
   placing the double poly structures in predetermined locations in a layout, and
   routing connections between the double poly structures placed according to net connectivity patterns from the standard cell function library to implement predetermined logic functions.

11. The computer system of claim 10, wherein each single poly structure comprises a p-mos FET and an N-mos FET, the p-mos FET and n-mos FET each having a gate, a source, and a drain, the gates of the p-mos FET and n-mos FET being connected together.

12. The computer system of claim 11, wherein the instruction codes assigned to a p-mos FET transistor and an n-mos FET transistor to a single poly structure comprise:
   if a p-mos FET transistor and a n-mos FET transistor share a gate connection node, assigning the p-mos FET transistor and the n-mos FET transistor to a common single poly structure,
   if no p-mos FET transistor and no n-mos FET transistor share a connection node, assigning an extra p-mos FET transistor to join the n-mos FET transistor in a common single poly structure wherein a source and a gain of the extra p-mos FET transistor are tied to a power source, and
   if no p-mos FET transistor and no n-mos FET transistor share a connection node, assigning an extra n-mos FET transistor to join a selected p-mos FET transistor in a common single poly structure wherein a source and a gain of the extra n-mos FET transistor are tied to a ground source.

13. The computer system of claim 12, wherein the instruction codes merging two single poly structures to form a double poly structure comprise:
   if a p-mos FET transistor from a first single poly structure and a p-mos FET transistor from a second single poly structure share a common source, the first and second single poly structures are merged together to form a double poly structure,
   if a p-mos FET transistor from a first single poly structure and a p-mos FET transistor from a second single poly structure share a common drain, the first and second single poly structures are merged together to form a double poly structure,
   if an n-mos FET transistor from a first single poly structure and an n-mos FET transistor from a second single poly structure share a common source, the first and second single poly structures are merged together to form a double poly structure,
   if an n-mos FET transistor from a first single poly structure and an n-mos FET transistor from a second single poly structure share a common drain, the first and second single poly structures are merged together to form a double poly structure, and
   if there is an unmatched single poly structure, a spare single poly structure are merged with the unmatched single poly structure to form a double poly structure wherein a source and a drain of the p-mos FET transistor and the n-mos FET transistor in the spare single poly structure are tied together.

14. The computer system of claim 10, wherein the double poly structures are placed according to the instruction codes in the layout such that placement and routing costs are minimized.

15. The computer system of claim 14, wherein placement cost comprises net routing length.

16. The computer system of claim 14, wherein placement cost comprises net cross-talking.

* * * * *